(12) United States Patent
Czarnecki

(10) Patent No.: US 9,116,178 B1
(45) Date of Patent: Aug. 25, 2015

(54) CIRCUIT TESTER WITH VARIABLE VOLUME AUDIBLE VOLTAGE INDICATION

(71) Applicant: Reliance Controls Corporation, Racine, WI (US)

(72) Inventor: Neil A. Czarnecki, Mt. Pleasant, WI (US)

(73) Assignee: Reliance Controls Corporation, Racine, WI (US)

( * ) Notice: Subject to any disclaimer, the term of this patent is extended or adjusted under 35 U.S.C. 154(b) by 224 days.

(21) Appl. No.: 13/649,533

(22) Filed: Oct. 11, 2012

(51) Int. Cl.
| *G01R 31/00* | (2006.01) |
| *G01R 19/145* | (2006.01) |
| *G01R 31/02* | (2006.01) |
| *G01R 31/04* | (2006.01) |

(52) U.S. Cl.
CPC .............. *G01R 19/145* (2013.01); *G01R 31/02* (2013.01); *G01R 31/041* (2013.01)

(58) Field of Classification Search
CPC ........ G01R 19/14; G01R 19/16; G01R 19/45; G01R 31/041; G01R 31/025; G01R 31/02; G01R 27/18; G09B 21/00; H04R 1/38; H04R 9/08; H04R 25/00; H01R 11/00; H04B 1/03; H04B 1/034
USPC ........................ 324/51, 53, 66, 114, 133, 149, 324/156–157, 383, 508, 511, 543, 555–556, 324/725; 340/251, 252, 372, 381, 383, 500, 340/540, 635, 654, 656; 379/21; 73/866.5
See application file for complete search history.

(56) References Cited

U.S. PATENT DOCUMENTS

| 1,957,173 | A | * | 5/1934 | Kindelmann et al. | ......... 369/115 |
| 2,606,228 | A | * | 8/1952 | Chouljian | ...................... 439/378 |
| 3,141,070 | A | * | 7/1964 | De Haan et al. | .............. 381/357 |
| 3,491,214 | A | * | 1/1970 | Rosemond et al. | ........... 381/330 |
| 3,527,902 | A | * | 9/1970 | Vanliempd | ..................... 381/356 |
| 4,004,223 | A | * | 1/1977 | Cohen | ........................... 324/707 |
| 4,105,968 | A | * | 8/1978 | Mobley et al. | ................ 324/133 |
| 4,127,807 | A | * | 11/1978 | Peplow et al. | ................ 324/508 |
| 4,155,082 | A | * | 5/1979 | Jones et al. | .................... 340/656 |
| 4,280,092 | A | * | 7/1981 | Wells et al. | .................... 324/508 |
| 4,725,772 | A | | 2/1988 | Peak | |
| 4,816,746 | A | | 3/1989 | Peak | |
| 4,945,346 | A | * | 7/1990 | Schmiemann | ................ 324/508 |
| D312,583 | S | * | 12/1990 | Kopp | .............................. D10/78 |
| 5,109,200 | A | * | 4/1992 | Dushane et al. | .............. 324/508 |
| 5,319,306 | A | | 6/1994 | Schuyler | |
| 5,331,283 | A | | 7/1994 | Sheldon | |
| 6,020,822 | A | | 2/2000 | Marshall | |
| 6,246,225 | B1 | | 6/2001 | Schaefer | |
| 6,462,555 | B1 | | 10/2002 | Schaefer | |
| 6,496,588 | B1 | * | 12/2002 | Chang | ........................... 381/358 |
| 6,657,435 | B2 | * | 12/2003 | Brown | .......................... 324/508 |
| 6,731,217 | B1 | | 5/2004 | Warner | |
| 6,979,787 | B2 | * | 12/2005 | Davies | ......................... 200/51 R |
| 6,982,558 | B2 | * | 1/2006 | Bryndzia et al. | .............. 324/556 |

(Continued)

*Primary Examiner* — Vincent Q Nguyen
*Assistant Examiner* — Felicia Farrow
(74) *Attorney, Agent, or Firm* — Boyle Fredrickson, S.C.

(57) ABSTRACT

A circuit tester for testing operation of an electrical receptacle includes a speaker that generates an audible signal when a voltage is present at the electrical receptacle. A cap on the end of the circuit tester includes openings on the side through which the audible signal may pass. The cap may be rotated on/off the housing such that the openings on the side of the cap move along the side of the circuit tester and become partly or fully obstructed by the side of the circuit tester, thereby varying the volume of the audible signal.

16 Claims, 6 Drawing Sheets

(56) References Cited

U.S. PATENT DOCUMENTS

| | | | |
|---|---|---|---|
| 7,010,138 B1* | 3/2006 | Harris et al. | 381/337 |
| 7,102,344 B1 | 9/2006 | Short | |
| 2007/0269059 A1* | 11/2007 | Akino et al. | 381/170 |
| 2009/0189597 A1* | 7/2009 | Lagerberg et al. | 324/133 |
| 2009/0212964 A1 | 8/2009 | Hibma et al. | |
| 2011/0013800 A1* | 1/2011 | Akino | 381/361 |

\* cited by examiner

CIRCUIT TESTER WITH VARIABLE VOLUME AUDIBLE VOLTAGE INDICATION

BACKGROUND OF THE INVENTION

The present invention relates generally to a test device for electrical circuits and, more particularly, to a circuit tester providing an audible indication that voltage is present at an outlet and which includes a variable volume feature.

When installing or maintaining the electrical service in a building, it is sometimes necessary to test operation of an outlet or to identify which circuit breaker supplies voltage to an outlet. Although the sequence of steps is different for each operation, the general principle is the same. When testing operation of the outlet, a circuit breaker is initially in the off position such that no voltage is provided to the outlet. A test device is inserted into the outlet and the circuit breaker is turned on. The test device provides an indication of voltage being present at the outlet. When identifying which circuit breaker supplies voltage to an outlet, the circuit breaker is initially in the on position such that voltage is provided to the outlet. The test device is inserted into the outlet and provides an indication that voltage is present at the outlet. Individual circuit breakers are turned off and the test device is monitored after each circuit breaker is turned off until it no longer provides the indication that voltage is present at the outlet.

In either instance, the outlet may be located some distance from the load center in which the circuit breakers are located. In residential construction, for example, the load center is typically located in a basement. The outlet to be tested may be located one or two stories above and/or across the house from the load center. Historically, it has been known to provide an audible alert to indicate that voltage is present at the outlet. However, if the outlet is located two stories above and across the house from the load center, the audible alert must be very loud to allow the person testing the outlet to hear the alert at the load center. Otherwise, the tester has to repeatedly travel between the load center and the outlet to determine whether the outlet is operating properly or to identify if the correct circuit breaker has been identified. This level of volume required to hear the alert between two stories and across a large residence may be undesirable when testing outlets in closer proximity to the load center, such as in a finished basement. Thus, it would be desirable to provide a circuit tester configured to provide an audible alert for which the volume may be controlled to a desired level.

SUMMARY OF THE INVENTION

The present invention is directed to a circuit tester for testing operation of an electrical receptacle. The electrical receptacle includes a hot socket electrically connected to a hot lead of an electrical service and a neutral socket electrically connected to a neutral lead of the electrical service. The circuit tester includes a speaker or other sonic device that generates an audible signal when a voltage is present at the electrical receptacle. The volume of the audible signal is loud enough that the circuit tester may be plugged into a receptacle at one location in a building and an operator can turn on/off circuit breakers in a service panel located another location within the building and listen for the audible signal to determine which breaker supplies power to the receptacle. A cap on the end of the circuit tester includes apertures on the side through which the audible signal may pass. The cap may be rotated on/off the housing such that the apertures on the side of the cap move along the side of the circuit tester and become partly or fully obstructed by the side of the circuit tester, thereby varying the volume of the audible signal.

According to one embodiment of the invention, a circuit tester tests operation of an electrical receptacle. The circuit tester includes a housing having an opening extending through an end of the housing and a set of prongs extending from the housing and configured to be inserted into the electrical receptacle. The set of prongs includes at least a first prong configured to engage the hot socket of the receptacle and a second prong configured to engage the neutral socket of the receptacle. An audible signal generator is mounted within the housing proximate to the opening in the end of the housing and is configured to emit an audible signal through the opening in the end of the housing when a voltage potential is present across the first prong and the second prong. A volume modulator is operatively connected with the end of the housing. The volume modulator includes an end having a closed area at least as large as the opening in the end of the housing and aligned with the opening. At least one side surface extends from the end of the volume modulator and operatively engages the housing to translate an inner periphery of the side surface with respect to an outer surface of the housing, varying the distance between the closed area of the volume modulator and the opening in the end of the housing between an open position, a closed position, and at least one intermediate position. A plurality of apertures extends through the side surface. At least a portion of each of the plurality of apertures is positioned beyond the end of the housing when the volume modulator is in the open position and the intermediate position, and each of the apertures is positioned along the outer surface of the housing in the closed position.

According to another aspect of the invention, the volume modulator operatively engages the housing such that the distance between the closed area of the volume modulator and the opening in the end of the housing is continuously varied between the open position and the closed position. Cross-sections of the end of the housing and of the volume modulator may be generally circular. A portion of the outer surface of the housing proximate to the end of the housing may be threaded, and a portion of the inner periphery of the volume modulator may be threaded complementary to the housing to operatively engage the housing. The threaded portion may be configured such that a plurality of rotations of the volume modulator translates the volume modulator between the open and closed positions.

According to another embodiment of the invention, a circuit tester for testing operation of an electrical receptacle includes a housing having a first end, a second end, and a generally cylindrical outer wall extending between the first end and the second end. A portion of the outer wall proximate to the second end is threaded. A plurality of prongs extends from the first end and is configured to be inserted into the electrical receptacle. An audible signal generator oriented within the housing emits an audible signal from the second end of the housing when a voltage is present between a first prong and a second prong selected from the plurality of prongs. A volume modulator includes a generally closed first end, a generally open second end, a cylindrical outer wall extending between the first and second ends, and a plurality of apertures extending through the outer wall proximate to the first end of the volume modulator. A portion of the inner periphery of the outer wall proximate to the second end is threaded complementary to the threaded portion of the outer wall of the housing, and the volume modulator may be rotatable between a first position and a second position with respect to the housing. In the first position, the plurality of apertures is located beyond the second end of the housing, and in the second position, the plurality of apertures is located between the first and the second ends of the housing.

According to another embodiment of the invention, a circuit tester for detecting the presence of voltage in an electrical receptacle includes a housing, a set of prongs extending from the housing, a means for generating an audible signal indicating the presence of voltage at the set of prongs, and a means for varying or modulating the volume of the audible signal.

Various other features, objects and advantages of the present invention will be made apparent from the following detailed description of the drawing figures.

BRIEF DESCRIPTION OF THE DRAWINGS

Various exemplary embodiments of the subject matter disclosed herein are illustrated in the accompanying drawings in which like reference numerals represent like parts throughout, and in which.

DETAILED DESCRIPTION OF THE PREFERRED EMBODIMENT

Figure 1:
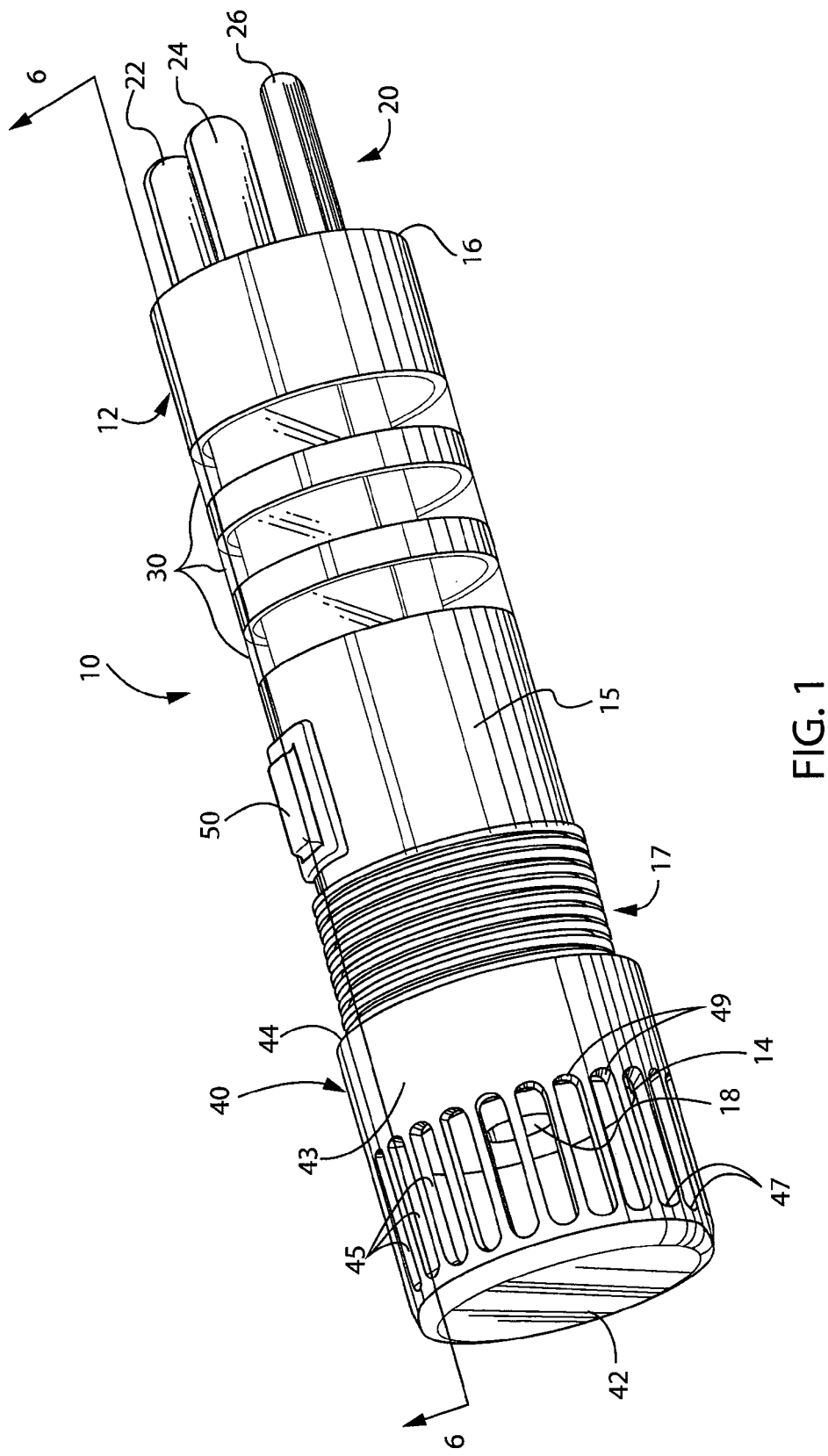
FIG. 1 is a perspective view of a circuit tester according to one embodiment of the invention in which the volume modulator is fully open.
Figure 2:
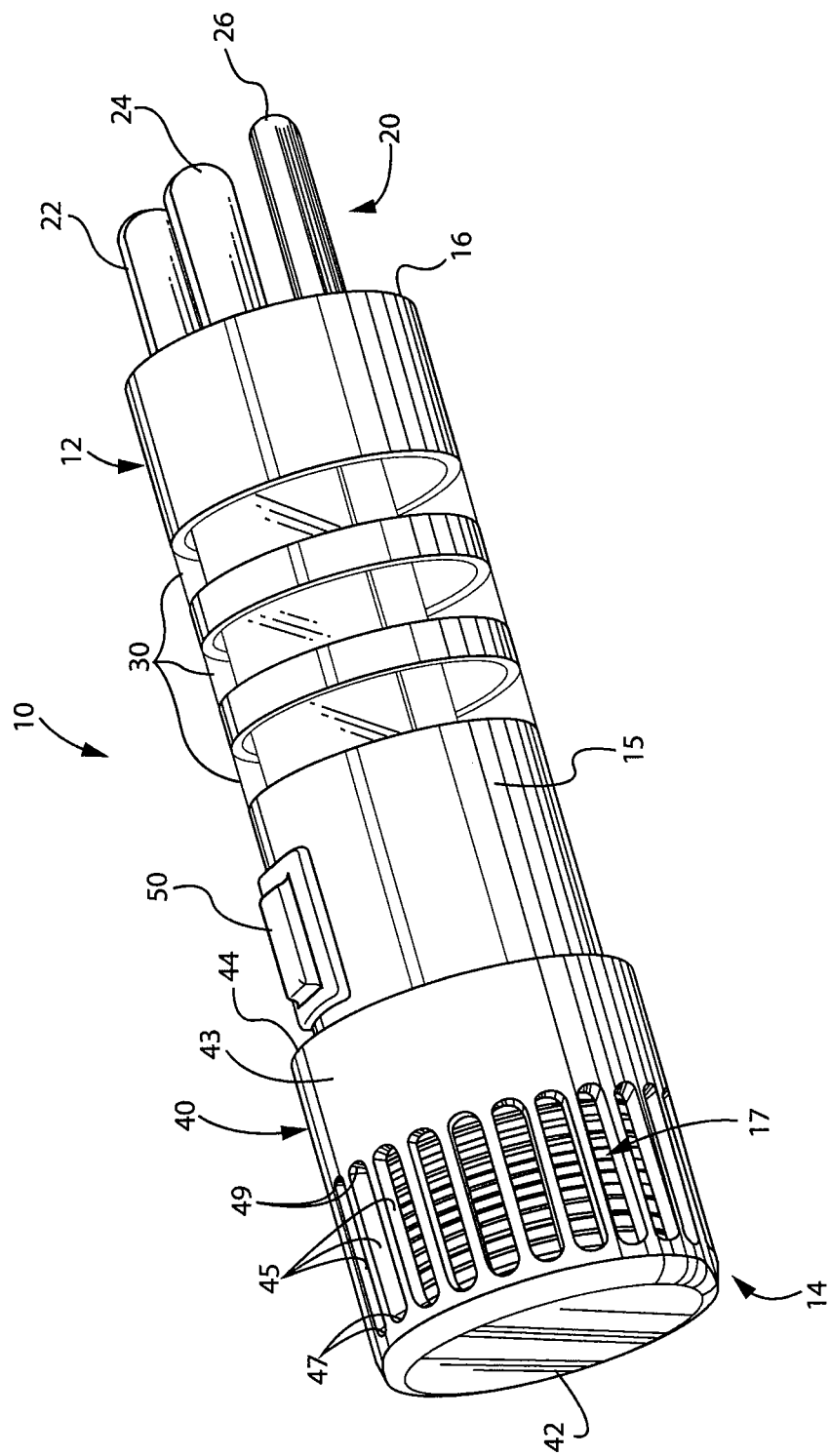
FIG. 2 is a perspective view of the circuit tester of FIG. 1 in which the volume modulator is fully closed.

The various features and advantageous details of the subject matter disclosed herein are explained more fully with reference to the non-limiting embodiments described in detail in the following description.

Referring to FIGS. 1-5, a circuit tester 10 in accordance with the present invention includes a housing 12 having a first end 14, a second end 16, and a generally cylindrical outer wall 15 extending between the two ends. An opening 18 extends through the first end 14 of the housing 12, and a set of prongs 20 extends from the second end 16 of the housing 12. The set of prongs 20 is configured to be inserted into an electrical receptacle, or outlet, to test operation of the electrical receptacle. According to the illustrated embodiment, the set of prongs 20 includes a first prong 22, a second prong 24 and a third prong 26. The first prong 22 is be configured to engage a first socket in the electrical receptacle that is connected to a hot conductor. The second prong 24 is be configured to engage a second socket in the electrical receptacle that is connected to a neutral conductor. The third prong 26 is be configured to engage a third socket in the electrical receptacle that is connected to a ground conductor. Optionally, the set of prongs 20 may include only the first prong 22 and the second prong 24. It is further contemplated that numerous other configurations may exist for the set of prongs 20 according to the electrical distribution system to which the electrical receptacle is configured to be connected.

Figure 6:
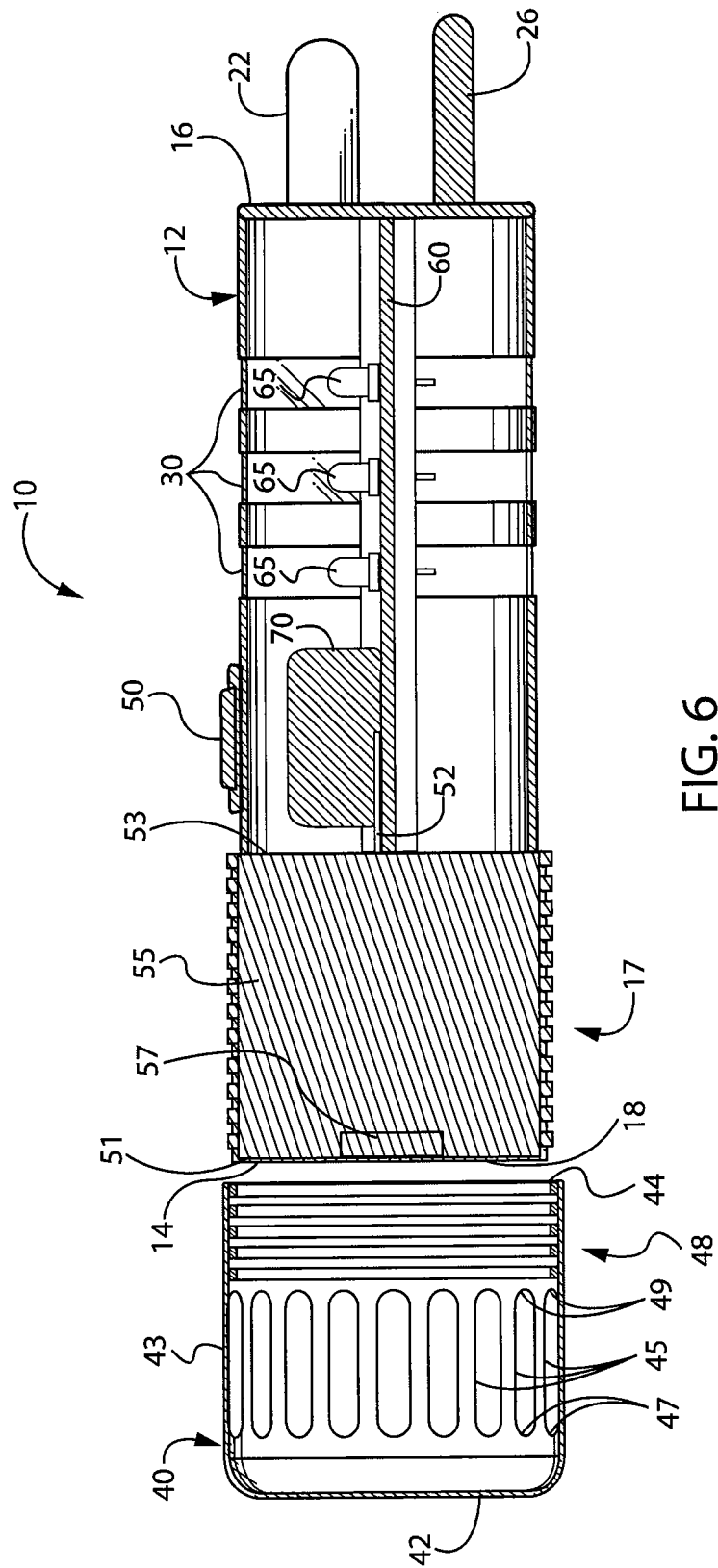
FIG. 6 is a cross-sectional view of the circuit tester of FIG. 1 taken at line 6-6 of FIG. 1.

The circuit tester 10 includes one or more windows 30 through which a visual indicator may be observed. Referring also to FIG. 6, the visual indicator may be a light-emitting diode (LED) 65. As illustrated, the circuit tester 10 includes three windows 30 each aligned with a corresponding visual indicator. The visual indicators may be used to provide an indication to the user whether the circuit is wired correctly or incorrectly. For example, enabling various combinations of the visual indicators may indicate that one of the conductors is not connected, a pair of conductors has been interchanged, or the electrical receptacle is properly wired.

In addition to visual indicators, the circuit tester 10 includes an audible signal generator 55 contained within the housing 12. According to the embodiment illustrated in FIG. 6, the audible signal generator 55 is a piezoelectric speaker having a first end 51 and a second end 53. The audible signal generator 55 is configured to emit an audible signal from a recessed portion 57 in the first end 51. The recessed portion 57 is aligned proximate to the opening 18 in the first end 14 of the housing 12 such that the audible signal is emitted therethrough. The audible signal generator 55 is electrically connected to a circuit board 60 via pins 52 extending from the second end 53 proximate to the circuit board 60. Other electrical components, such as a capacitor 70, are mounted to the circuit board 60 as required to energize the audible signal generator 55 when voltage is present between the first and second prongs, 22 and 24 respectively. A switch 50 is included in the circuit to selectively enable/disable the audible signal generator 55 if, for example, the user wishes to observe the visual indicators without receiving an audible signal. It is understood that any other suitable audible signal generators or sonic devices such as buzzers or other magnetic or electronic speakers may be used without deviating from the scope of the invention.

The circuit tester 10 also includes a volume modulator 40 operatively connected to the first end 14 of the housing 12 to vary the volume of the audible signal emitted from the audible signal generator 55. The volume modulator 40 includes a first end 42, a second end 44, and a generally cylindrical outer wall 43 extending between the two ends. According to the illustrated embodiment, the first end 42 includes a generally planar surface having an outer periphery defined by the outer wall 43. The second end 44 is generally open and configured to receive the first end 14 of the housing 12. A portion 48 of the inner surface proximate to the second end 44 of the volume modulator 40 is threaded, and a portion 17 of the outer wall 15 of the housing 12 is also threaded complementary to the threaded portion 48 of the volume modulator 40. Consequently, the volume modulator 40 rotatably engages the housing 12 of the circuit tester 10.

A plurality of apertures 45 are spaced around the periphery of the outer wall 43 of the volume modulator 40. The apertures 45 are generally elongated and have a first end 47 and a second end 49. The apertures 45 extend orthogonal to the second end 49 along a portion of the outer wall 43 with the first end 47 proximate to the first end 42 of the volume modulator 40 and a second end 49 in a central portion of the cylindrical outer wall 43. Optionally, the apertures 45 may have numerous other shapes and orientations without deviating from the scope of the invention.

Figure 3:
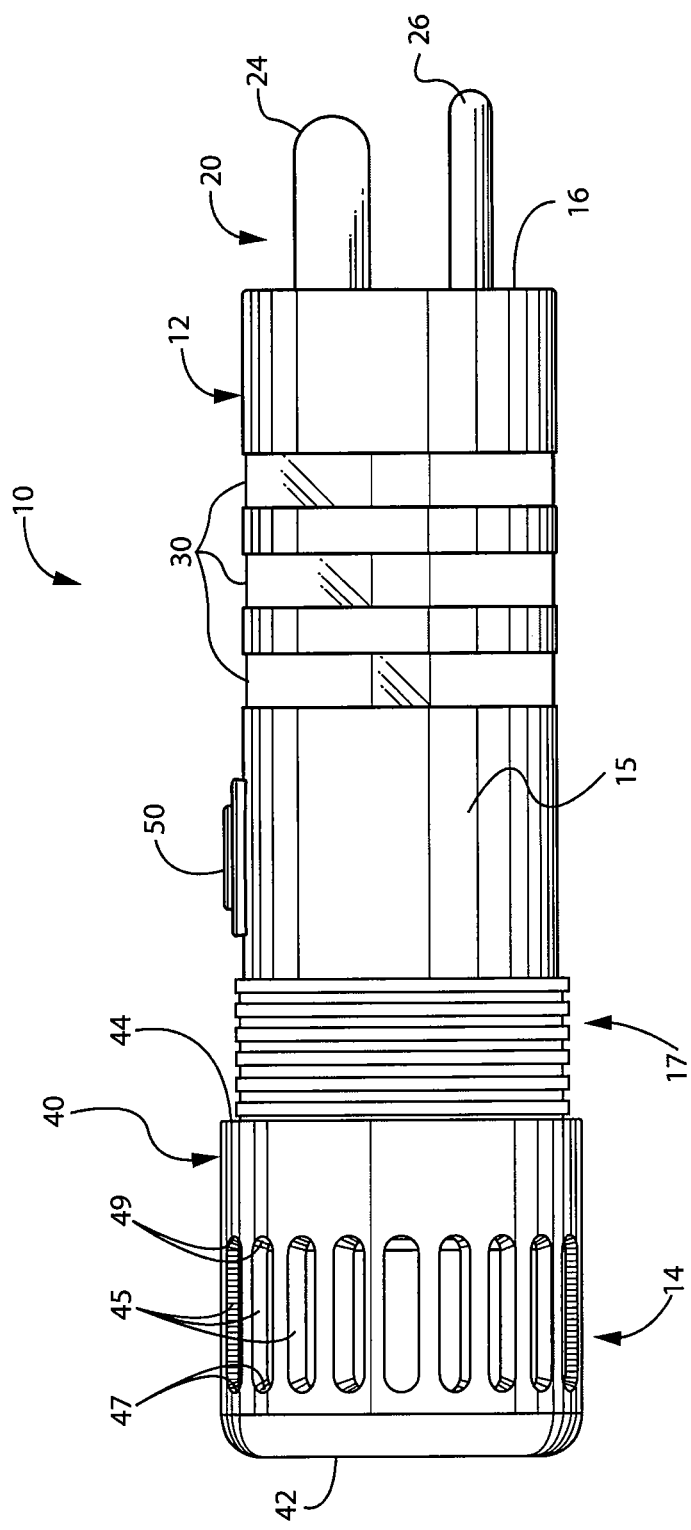
FIG. 3 is a side elevation view of the circuit tester of FIG. 1 in which the volume modulator is fully open.
Figure 4:
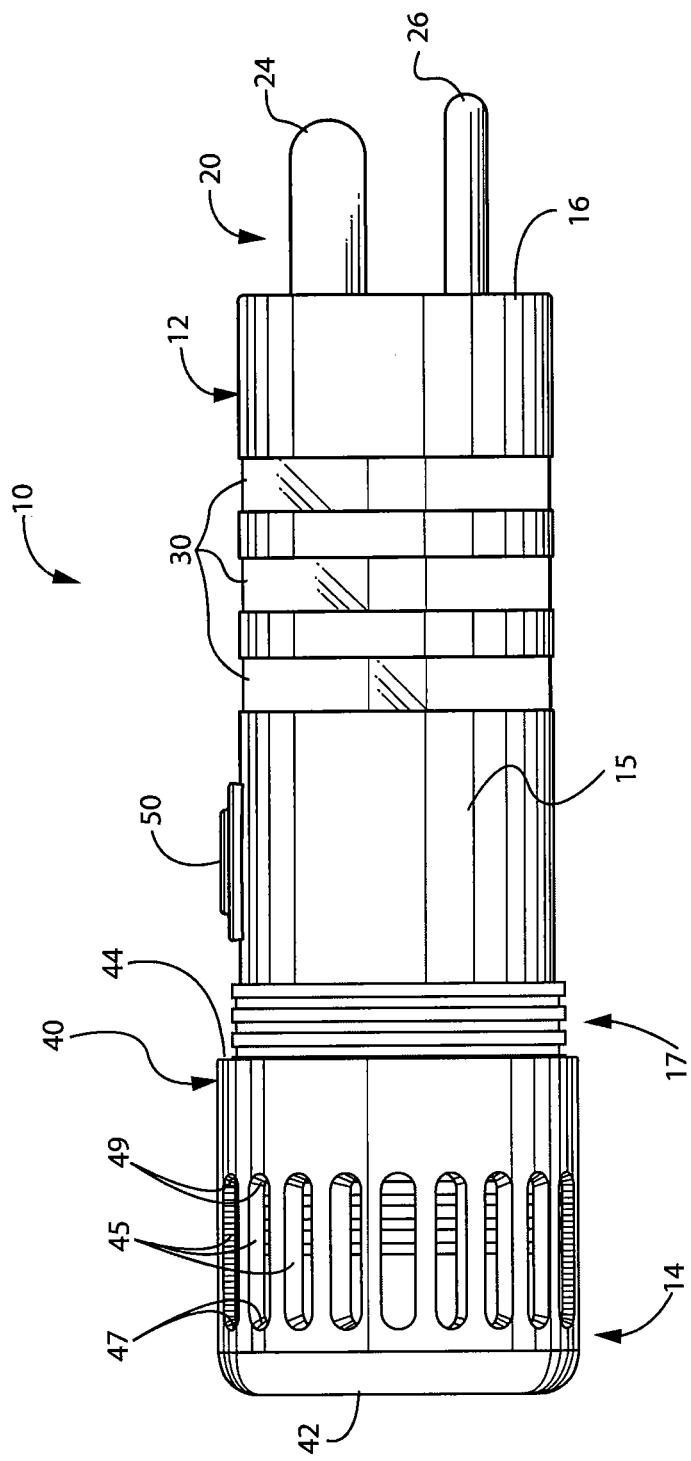
FIG. 4 is a side elevation view of the circuit tester of FIG. 1 in which the volume modulator is partially open.
Figure 5:
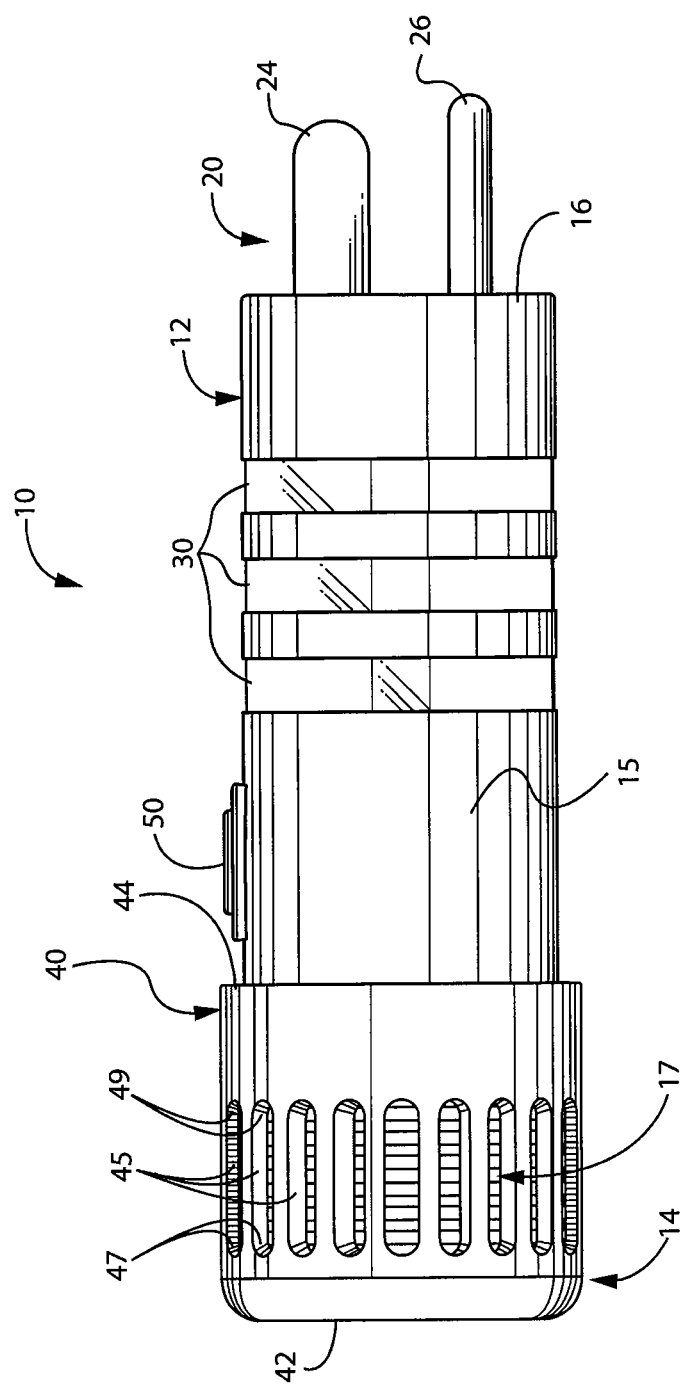
FIG. 5 is a side elevation view of the circuit tester of FIG. 1 in which the volume modulator is fully closed.

With reference to FIGS. 3-5, the volume modulator 40 is movable between an open position and a closed position. As the volume modulator 40 is rotated with respect to the housing 12, the complementary threaded portions, 48 and 17 respectively, engage to draw the volume modulator 40 either on to, or off of, the housing 12. In FIG. 3, the volume modulator 40 is illustrated in a fully open position. The second end 49 of each of the apertures 45 is generally aligned with the first end 14 of the housing 12, thereby maximizing the volume of the apertures 45 through which the audible signal may travel and, consequently, maximizing the volume of the audible signal emitted from the circuit tester 10. As the volume modulator 40 is rotated in a first direction, it is drawn from the open position to an intermediate position, as shown in FIG. 4. The second end 49 of each aperture 45 is translated along the outer wall 15 of the housing 12 such that a portion of each aperture 45 is obstructed by the outer wall 15 of the housing 12 and a portion of each aperture 45 remains unobstructed such that the audible signal is emitted therethrough. As the volume modulator 40 is rotated further in the first direction, it is drawn from the intermediate position to a closed position, as shown in FIG. 5. The first end 47 of each aperture is now generally aligned with or translated beyond the first end 14 of the housing 12 such that the entire aperture 45 is obstructed by the outer wall 15 of the housing 12. As a result, the audible signal must be transmitted through a solid material, such as the first end 42 of the volume modulator 40, rather than air, thereby minimizing the volume of the audible signal emitted from the circuit tester 10. When the volume modulator 40 is rotated in a second direction, opposite the first direction, the steps are reversed and the volume modulator 40 is moved from the closed position to the open position. Because the volume modulator 40 engages the housing 12 via the respective threaded portions, 48 and 17, the volume is continuously adjustable between the maximum volume and the minimum volume. Preferably, the fit between the modulator 40 and the housing 12 is configured such that the friction between the two threaded portions, 48 and 17 respectively, is sufficient to resist motion independent of a user. Thus, the threaded engagement of the volume modulator 40 with the housing 12 provides numerous intermediate positions over which a wide range and fine control of the volume may be achieved.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention

What is claimed is:

1. A circuit tester for testing operation of an electrical receptacle, the electrical receptacle including a hot socket electrically connected to a hot lead of an electrical service and a neutral socket electrically connected to a neutral lead of the electrical service, the circuit tester comprising:
   a housing having a first end, a second end, an opening extending through the first end of the housing, and an axis extending between the first end and the second end;
   a set of prongs extending from the housing and configured to be inserted into the electrical receptacle, the set of prongs including at least a first prong configured to engage the hot socket of the receptacle and a second prong configured to engage the neutral socket of the receptacle;
   an audible signal generator mounted within the housing proximate to the opening in the first end of the housing, wherein the audible signal generator is configured to emit an audible signal through the opening in the first end of the housing when a voltage potential is present across the first prong and the second prong; and
   a volume modulator operatively connected with the first end of the housing, the volume modulator further comprising:
      an end having a closed area at least as large as the opening in the first end of the housing, the closed area aligned with the opening;
      at least one side surface extending from the end of the volume modulator and operatively engaging the housing to translate an inner periphery of the side surface with respect to an outer surface of the housing, varying the distance along the axis of the housing between the closed area of the volume modulator and the opening in the first end of the housing between an open position, a closed position, and at least one intermediate position, and
      a plurality of apertures extending through the side surface, wherein at least a portion of each of the plurality of apertures is positioned beyond the first end of the housing when the volume modulator is in the open position and the intermediate position and each of the apertures is positioned along the outer surface of the housing in the closed position.

2. The circuit tester of claim 1 wherein the volume modulator operatively engages the housing such that the distance between the closed area of the volume modulator and the opening in the first end of the housing is continuously varied between the open position and the closed position.

3. The circuit tester of claim 1 wherein:
   a cross-section of the first end of the housing is generally circular;
   a portion of the outer surface of the housing proximate to the first end of the housing is threaded;
   a cross-section of the volume modulator is generally circular; and
   a portion of the inner periphery of the volume modulator is threaded complementary to the housing to operatively engage the housing.

4. The circuit tester of claim 3 wherein a plurality of rotations of the volume modulator translates the volume modulator between the open and closed positions.

5. The circuit tester of claim 1 further comprising a switch configured to enable and disable the audible signal generator.

6. A circuit tester for testing operation of an electrical receptacle, comprising:
   a housing having a first end, a second end, and a generally cylindrical outer wall extending between the first end and the second end, wherein a portion of the outer wall proximate to the second end is threaded;
   a plurality of prongs extending from the first end and configured to be inserted into the electrical receptacle;
   an audible signal generator oriented within the housing to emit an audible signal from the second end of the housing when a voltage is present between a first prong and a second prong selected from the plurality of prongs; and
   a volume modulator including:
      a generally closed first end,
      a generally open second end,
      a cylindrical outer wall extending between the first and second ends, and
      a plurality of apertures extending through the outer wall proximate to the first end of the volume modulator, wherein a portion of the inner periphery of the outer wall proximate to the second end is threaded complementary to the threaded portion of the outer wall of the housing.

7. The circuit tester of claim 6 wherein the volume modulator is rotatable between a first position and a second position with respect to the housing, wherein in the first position the plurality of apertures are located beyond the second end of the housing and wherein in the second position the plurality of apertures are located between the first and the second ends of the housing.

8. A circuit tester for detecting the presence of voltage in an electrical receptacle, the circuit tester comprising:
   a housing having a first end, a second end, an axis extending between the first end and the second end, and a first opening extending through the housing through which an audible signal is emitted;
   a cap movably mounted to the housing proximate to the first opening, wherein:
      the cap has at least one aperture that cooperates with the housing to define at least one second opening through which the audible signal is emitted,
      the cap is moveable between an open position and a closed position; and
      the open position is displaced from the closed position along the axis of the housing;
   a set of prongs extending from the housing;
   a means for generating the audible signal, wherein the audible signal indicates the presence of voltage at the set of prongs; and
   a means for varying a size of the at least one second opening in order to vary the volume of the audible signal.

9. The circuit tester of claim 8, wherein the audible signal generator comprises a speaker mounted to the housing and that emits an audible signal outwardly from the housing, and wherein the means for varying the size of the at least one second opening is interconnected with the housing.

10. The circuit tester of claim 9, wherein the speaker emits the audible signal into a space located exteriorly of the housing, and wherein the means for varying the size of the at least one second opening at least in part defines the space.

11. The circuit tester of claim 10, wherein the cap includes an end surface located over the speaker, and further includes one or more sidewalk extending between the end surface and the housing.

12. The circuit tester of claim 11, wherein the one or more sidewalls of the cap includes the at least one aperture and wherein the audible signal passes through the at least one aperture.

13. The circuit tester of claim 12, wherein the cap and the housing include variable position engagement structure that enables the cap to be moved toward and away from the housing, wherein movement of the cap toward the housing advances a portion of the housing over one or more of the apertures to close the second opening and thereby decrease the effective size of the second opening through which the audible signal can pass, and wherein movement of the cap away from the housing retracts the portion of the housing from one or more of the apertures to expose the second opening and thereby increase the effective sue of the second opening through which the audible signal can pass.

14. The circuit tester of claim 13, wherein the variable position engagement structure comprises mating threads on the side wall of the cap and the housing.

15. A method of varying the volume of an audible signal in an electrical circuit tester having a housing with, a first end, a second end, an axis extending between the first end and the second end, and an opening extending through the first end of the housing, and an audible signal generator mounted within the housing proximate to the opening, comprising the act of moving a modulator relative to the axis of the housing of the electrical circuit tester over the audible signal generator, wherein movement of the modulator relative to the housing functions to vary the size of openings in the modulator through which the audible signal passes and wherein the modulator includes a closed end wall aligned with the opening in the housing and one or more sidewalls within which the openings in the modulator are formed.

16. The method of claim 15, wherein the act of moving the modulator relative to the housing is carried out by means of a threaded connection between the modulator and the housing.

* * * * *